(12) United States Patent
Weng et al.

(10) Patent No.: US 7,227,388 B2
(45) Date of Patent: Jun. 5, 2007

(54) PROPAGATION DELAY CHARACTERISTIC COMPARATOR CIRCUIT

(75) Inventors: Matthew Weng, Pleasanton, CA (US); Charles Vinn, Milpitas, CA (US)

(73) Assignee: Micrel, Incorporated, San Jose, CA (US)

( * ) Notice: Subject to any disclaimer, the term of this patent is extended or adjusted under 35 U.S.C. 154(b) by 58 days.

(21) Appl. No.: 11/124,869

(22) Filed: May 9, 2005

(65) Prior Publication Data

US 2006/0250164 A1 Nov. 9, 2006

(51) Int. Cl.
*H03K 5/22* (2006.01)
(52) U.S. Cl. .............................. 327/66; 327/563
(58) Field of Classification Search ................ 327/65, 327/66, 562, 563

See application file for complete search history.

(56) References Cited

U.S. PATENT DOCUMENTS

| 4,401,901 | A | | 8/1983 | Ochi |
| 5,115,151 | A | * | 5/1992 | Hull et al. ................ 327/65 |
| 6,121,798 | A | | 9/2000 | McQuilkin |
| 6,229,352 | B1 | * | 5/2001 | Chevallier et al. ........ 327/77 |
| 6,252,437 | B1 | * | 6/2001 | Fischer et al. ............. 327/89 |

* cited by examiner

*Primary Examiner*—Long Nguyen
*Assistant Examiner*—Ryan Jager
(74) *Attorney, Agent, or Firm*—Ladas & Parry LLP

(57) ABSTRACT

A comparator circuit having improved operational characteristics. A predetermined voltage drop device is provided, such as an exemplary embodiment Schottky diode, having an anode connected to circuit power supply voltage and an output stage of the comparator and a cathode connected to an input stage of the comparator. The predetermined voltage drop device effects a lowering of the power supply voltage for the output stage bias between said power supply voltage and said common voltage. This reduces the required swing of the output stage drivers during a comparator input signal transition and reduces propagation delay of said comparator.

6 Claims, 4 Drawing Sheets

US 7,227,388 B2

PROPAGATION DELAY CHARACTERISTIC COMPARATOR CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

The technology described herein is generally related to the field of electronic devices and more particularly to comparator circuits.

2. Description of Related Art

Data transmission speed is a crucial operational characteristic for computer and telecommunications implementations. One problem associated with comparator circuits commonly used in these types of equipment is signal propagation delay. Some prior art solutions are found in U.S. Pat. No. 4,401,901 (Ochi), U.S. Pat. No. 6,121,798 (McQuilkin) and U.S. Pat. No. 6,252,437 (Fischer et al.).

As computing and telecommunicating systems are continually challenged to provide increased signal processing speeds with lower power consumption, there is a need for improved circuitry.

While the exemplary embodiments described herein is illustrative of using semiconductor devices having a specific type, e.g., bipolar, CMOS, BiCMOS and the like elements, and specific transistor polarity implementations, it will be recognized by those skilled in the art that other implementations can be made within the scope of the invention. No limitation on the scope of the invention is intended by the exemplary embodiments and none should be implied therefrom.

BRIEF SUMMARY

The present invention relates to electrical circuitry, particularly integrated circuits. Generally, the present invention comprises a method for reducing propagation delay in a comparator circuit and for a comparator circuit itself having a reduced propagation delay characteristic.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

Like reference designations represent like features throughout the drawings. The drawings in this specification should be understood as not being drawn to scale unless specifically annotated as such.

DETAILED DESCRIPTION

Figure 1:
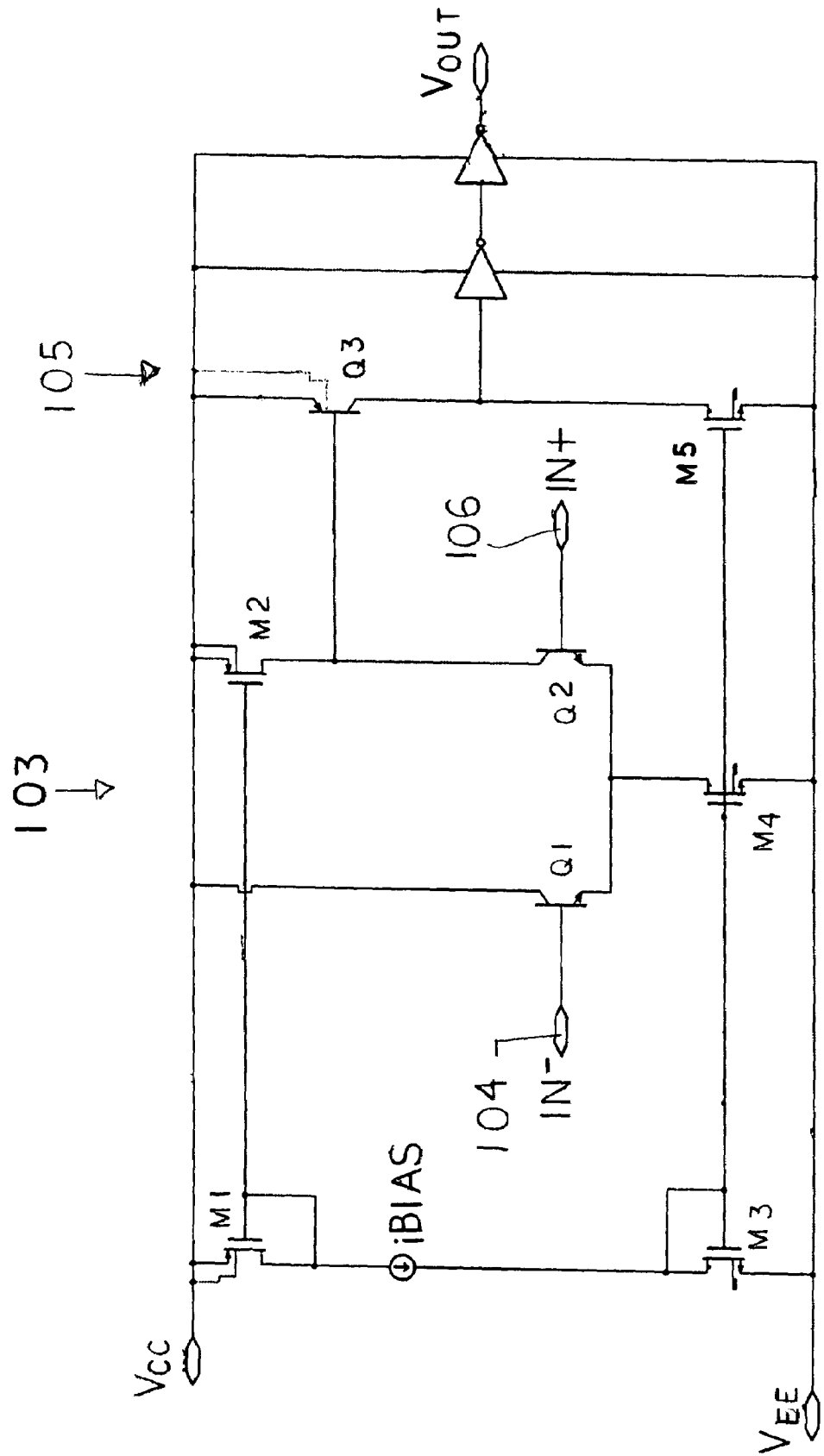
FIG. 1 (Prior Art) is a circuit schematic diagram depicting a typical, exemplary, two-stage comparator.

FIG. 1 (Prior Art) is a circuit diagram depicting a typical, exemplary, common mode, two-input (referred to hereinafter as "inPlus" and "inMinus"), two-stage comparator circuit 101. The circuit includes a known manner substantially constant power supply voltage, shown as "Vcc," and a common reference, or ground, shown as "Vee". The comparator 101 has two inputs 104 "IN−" referred to herein more simply as the "inMinus" side, and 106 "IN+" referred to herein more simply as the "inPlus" side. Generally, when the inPlus side signal is greater than the inMinus side signal, the output, Vout, will be a digital HIGH; conversely, when the inPlus side is less than the inMinus side, Vout will be LOW.

The first stage 103 is composed of a differential pair of transistors Q1, Q2, a current source iBias, a PMOS current source M2, and a tail current source M4. This is a known manner "I/2I" differential stage with the tail current via M4 equal to twice the drain current of M2. A second stage 105 is composed of a transistor Q3 and a current source M5. The differential pair Q1, Q2 is balanced when the input signals are equal, inPlus=inMinus, as half of the tail current via M4 will flow through each of the differential pair transistors Q1, Q2. In this exemplary circuit, because transistor M2 is a MOSFET type (metal-oxide semiconductor field-effect transistor), the base of transistor Q3 is forced to Vcc in an OFF state when inMinus is greater than inPlus. In order for there to be a switch in the output, e.g., from a LOW signal to a HIGH signal, the base of Q3 must be pulled down to a level equal to Vcc−Vbe such that transistor Q3 is turned ON. Drain gate connected MOSFETs M1 and M3 are connected form a known manner current reference for two current mirrors, where M1 is a reference for the current source from Vcc. M3 is a reference for a current sink to ground.

A propagation delay for a LOW-to-HIGH Vout output transition is determined, for the most part, by the time it takes to move the base of transistor Q3 from the Vcc level to approximately the Vcc−Vbe level.

Figure 2:
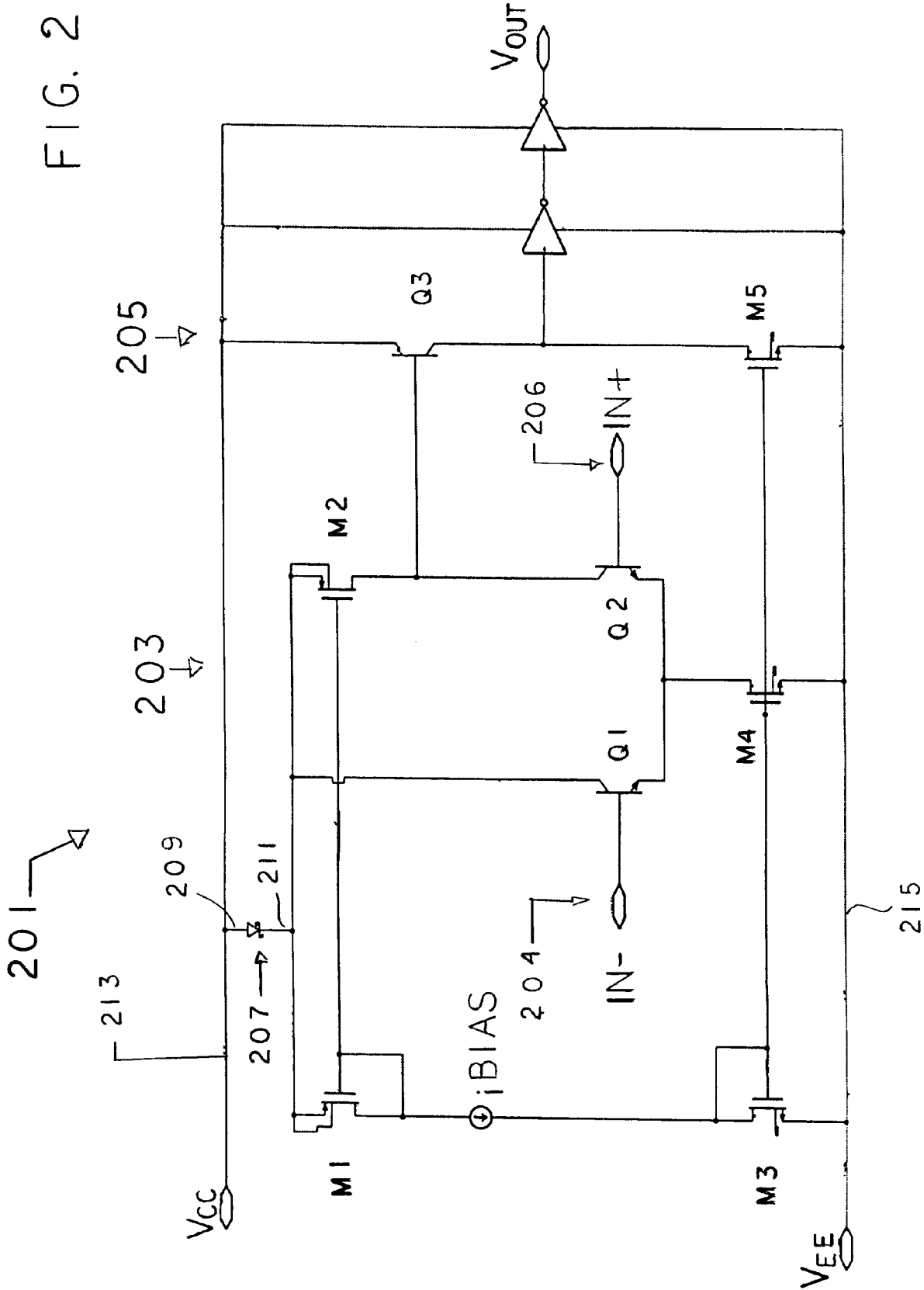
FIG. 2 is a circuit schematic diagram in accordance with an exemplary embodiment of the present invention.

FIG. 2 is a circuit schematic diagram in accordance with an exemplary embodiment of the present invention. Circuit 201 is a two-stage 203 (hereinafter also referred to as "input stage 203"), 205 (hereinafter also referred to as "output stage 205") comparator circuit with circuit components substantially identical to FIG. 1. Circuit 201 has differential inputs 204, inMinus, and 206, inPlus.

A Schottky diode 207 is provided, having and anode 209 and a cathode 211. The anode 209 is connected to the power supply voltage Vcc and to the Vcc input side of the output stage 205. The cathode 211 is connected to the Vcc input side of the input stage 203

Figure 3:
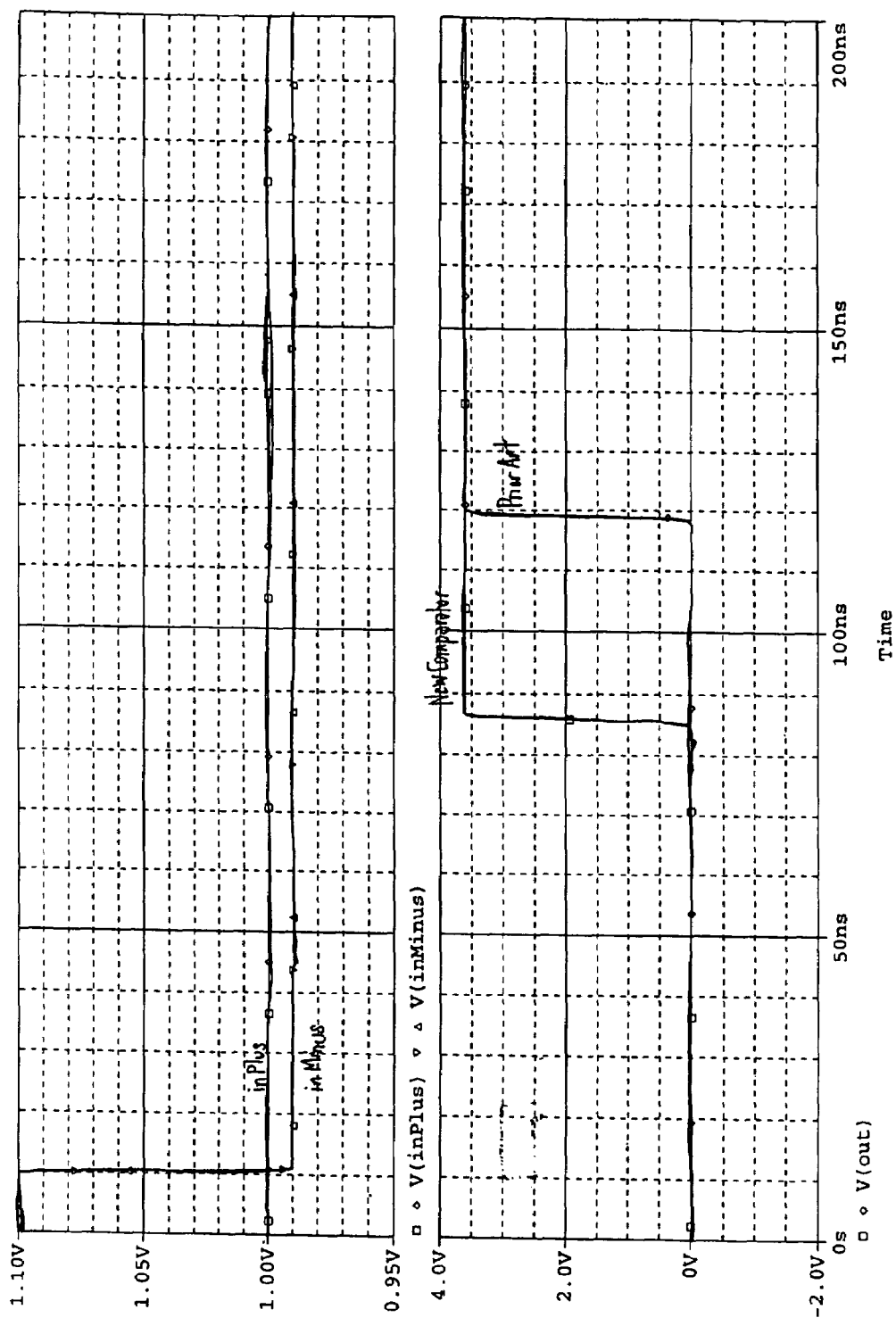
FIG. 3 is a waveform diagram illustrating the reduction of propagation delay by comparing performance of the circuit of FIG. 1 with the circuit of FIG. 2.

Turning also to FIG. 3, the waveforms of graph 301 shows a first exemplary voltage, "inPlus," having a constant level of 1.00V. This inPlus signal is on the plus (IN+) input 206 of comparator circuit 201. Graph 301 shows an exemplary voltage, "inMinus," having a changing level—going from a positive 1.10V at time t=0s to a positive 0.99V at approximately t=10 ns. This changing inMinus signal is on the comparator minus (IN−) side input 204.

In operation, the addition of the Schottky diode 207 inserted between Vcc and the source of M2 causes propagation delay to decrease. The voltage at the base of transistor Q3 in the OFF-state is now equal to:

$$Vcc-V_{SCHOTTKY},$$

rather than just Vcc. This means that switching the output from LOW to HIGH only requires that the base of transistor Q3 move by:

$$Vbe-V_{SCHOTTKY},$$

rather than a full Vbe transition fro Vcc. Because $V_{SCHOTTKY}$ is smaller than Vbe, transistor Q3 will still be properly turned OFF whenever:

$$inMinus>inPlus.$$

The current through the Schottky diode 207 stays constant because the tail current of M4 always flows through the Schottky diode no matter how it is distributed between transistor Q1 and transistor Q2. The source of MOSFET M2 effectively is acting as a secondary Vcc, also now equal to:

$$Vcc-V_{SCHOTTKY},$$

rather than the actual Vcc. Connecting the emitter of transistor Q3 to Vcc allows the circuitry to take advantage of the reduced swing amount, thus reducing propagation delay. The reduced swing amount improves the delay characteristic as illustrated by example in FIG. 3.

Looking now to graph 302, in accordance with a circuit 101 of the prior art, having given circuit components, a propagation delay for Vout may be expected to delay to a time of approximately t=120 ns; that is, the comparator circuit 101 propagation delay characteristic could be defined as approximately 110 ns (120 ns−10 ns). This is illustrated by the line marked "Prior Art." In accordance with the present invention, for the circuit 201, having the same given circuit components as circuit 101, the line marked "New Comparator" illustrates the improvement afforded by the addition of the Schottky diode 207. Now for the comparator circuit 201 has Vout occur at an approximate time of t=85 ns. Therefore the comparator circuit 201 propagation delay characteristic may be defined as approximately 75 ns (85 ns−10 ns), an improvement of approximately 30%.

In general, the inputs 104, 106 are referred to as a differential pair; the comparator 101 input stage 103 amplifies the difference between the input signals, IN−, IN+, to the output stage, namely, the difference between the voltage on the base of Q1 and the voltage on base of Q2, switching the output between HIGH and LOW accordingly.

Notice that generally in such a prior art circuit 101, FIG. 1, for the output Vout to switch levels LOW to HIGH, the transistor Q3 base-emitter voltage, Vbe, must swing from zero volts to a full Vbe value. In accordance with the exemplary embodiment present invention as shown in FIG. 2, the propagation delay 11 is reduced because the swing has been reduced by the amount of a predetermined voltage drop across the Schottky diode 207. In other words, the swing is related to the power supply voltage, Vcc, less the Schottky voltage (Vcc−$V_{SCHOTTKY}$) which biases the output transistor Q3 via MOSFET M2 such that the swing goes from Vcc−$V_{SCHOTTKY}$ volts to Vbe.

A more detailed comparison between the prior art in FIG. 1 and the exemplary embodiment of FIG. 2 illustrates the method of reducing propagation delay time. In FIG. 1 (Prior Art), the voltage swing required to flip the output stage transistor Q3 from OFF to ON is from Vcc down to (Vcc−$Vbe_{Q3}$), and the time for that voltage swing establishes the propagation delay characteristic of the comparator circuit 103. In other words, when OFF, the base of transistor Q3 is at Vcc, and when ON, the base of transistor Q3 is at Vcc−Vbe as established by MOSFET M2.

The present invention reduces the propagation delay characteristic through the recognition that the voltage swing can be reduced. In FIG. 2, when transistor Q3 is ON, the base is still at Vcc−Vbe, but when OFF is at (Vcc−$V_{SCHOTTKY}$) where $V_{SCHOTTKY}$ is less than Vbe. Thus, the required voltage swing to turn transistor Q3 to ON is reduced by the amount of the voltage drop across the Schottky diode 207, reducing the propagation delay in a direct relationship thereto. The reason the swing is reduced is that because of the Schottky diode connection to the power supply voltage, the drop across the MOSFET M2 is substantially zero when the differential stage is switched in turning transistor Q3 OFF. When a differential signal appears across transistor Q1 and transistor Q2 to turn OFF transistor Q3, all current through MOSFET M4 flows from transistor Q1, none from transistor Q2. Therefore the drop across MOSFET M2 is zero volts and the voltage superimposed across the base-emitter of transistor Q3 is equal to the Schottky voltage drop when transistor Q3 is OFF. When the differential signal is such to turn transistor Q3 OFF, no current flows through MOSFET M2. The voltage drop between the base and emitter of transistor Q3 is substantially now the Schottky voltage drop. Therefore, the present invention takes advantage of a speed increase achieved from causing transistor Q3 to not have to swing the full range as in the prior art from Vcc to Vbe to turn ON, but now only requiring a swing from $V_{SCHOTTKY}$ up to Vbe.

Figure 4:
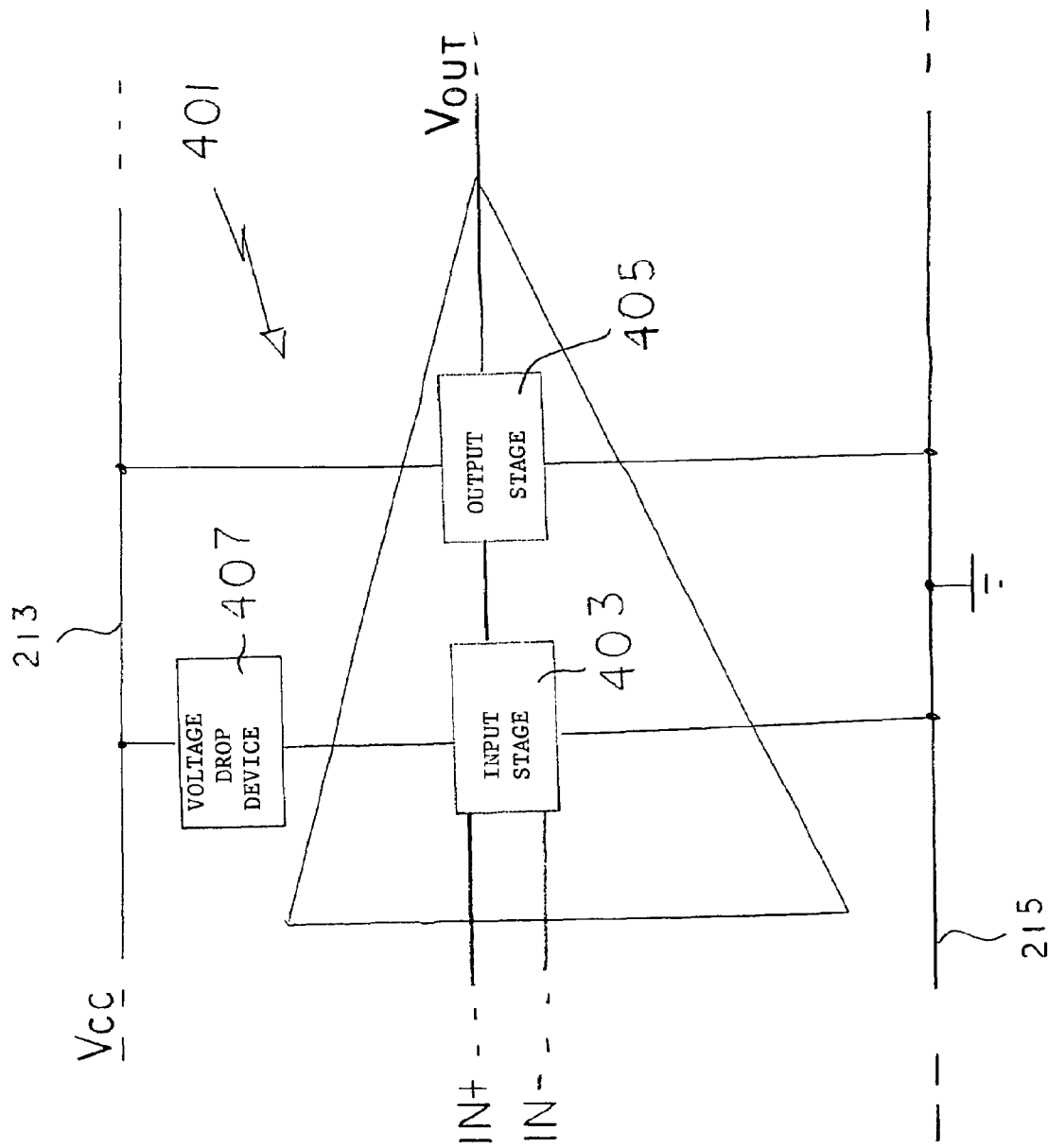
FIG. 4 is a schematic block diagram in accordance with the exemplary embodiment as shown in FIG. 2.

After switching, namely when the comparator 201 has settled with the output in either a HIGH or LOW state, the current through the Schottky diode 207 is constant. Therefore, the voltage that appears at the cathode 211 is substantially constant. It will be recognized by those skilled in the art, that other components may be substituted for the Schottky diode 207 in the form of a more generic power supply voltage drop device 407, as illustrated in FIG. 4. For example, a resistor having a given voltage drop across it, appropriately sized to the transistors used in the input stage 403 and output stage 405 of comparator 401, achieves the same effect.

Similarly, circuits in accordance with the present may be implemented by those skilled in the art in full CMOS design such as by substituting PMOS transistors, sized to have appropriate Vgs, for the bipolar transistors as shown in FIG. 2. There is no intent to limit the scope of the invention to the exemplary embodiment thereof nor should any such intent be implied therefrom.

It will be recognized by those skilled in the art that the invention can be extended to be implemented for any multistage comparator wherein a Schottky diode is provided between Vcc and each input side stage.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A comparator circuit, comprising:
   a first interconnect having a power supply voltage;
   an input stage having differential pair inputs;
   connected to said input stage, an output stage providing a digital output signal derived from a comparison of signals on said differential pair inputs; and
   a voltage drop device, having a given voltage drop characteristic, connecting said first interconnect and said input stage wherein said device reduces the power supply voltage to a lower power supply voltage bias to said input stage such that propagation delay characteristic for switching said digital output signal is reduced based on the given voltage drop characteristic, wherein said voltage drop device is a Schottky diode having an anode connected to said first interconnect and to said output stage and a cathode connected to said input stage.

2. The circuit as set forth in claim 1 wherein when the output stage is settled with the output in either a HIGH or LOW state, the current through the voltage drop device is substantially constant.

3. The circuit as set forth in claim 1 wherein when said output stage is in the LOW state the output stage is biased to the lower power supply voltage bias.

4. An improved comparator circuit, having a given power supply voltage and given common voltage connected for powering said circuit, the improved comparator circuit comprising:
   an input stage, having first comparator circuit input means for receiving a first input signal of a differential pair of signals being compared and second comparator circuit input means for receiving a second input signal of said differential pair;
   an output stage providing a digital output signal, having comparator circuit output means for deriving said digital output signal based on a difference between said first input signal and said second input signal; and
   an improvement including a means for establishing a predetermined voltage drop connecting said power supply voltage to said input stage wherein voltage swing for switching said output signal from a LOW state to a HIGH stage is reduced from a first difference between said given power supply voltage and a bias voltage required to turn said output stage to an ON condition to a second difference between said predetermined voltage drop to the bias voltage required to turn said output stage to said ON condition such that comparator propagation delay is reduced by an amount directly related to the predetermined voltage drop, wherein said means for establishing is a Schottky diode.

5. The improved comparator circuit as set forth in claim 4 wherein when the output stage is settled with the digital output signal in either a HIGH or LOW state, current through the means for establishing a predetermined voltage drop is substantially constant.

6. The improved comparator circuit as set forth in claim 4 wherein when said output stage is in the LOW state the output stage is biased to the predetermined voltage drop.

* * * * *